(12) United States Patent
Collonge et al.

(10) Patent No.: US 7,973,350 B2
(45) Date of Patent: Jul. 5, 2011

(54) STRAINED-CHANNEL TRANSISTOR DEVICE

(75) Inventors: Michael Collonge, Romans (FR); Maud Vinet, Rives (FR)

(73) Assignee: Commissariat a l'Energie Atomique, Paris (FR)

( * ) Notice: Subject to any disclaimer, the term of this patent is extended or adjusted under 35 U.S.C. 154(b) by 79 days.

(21) Appl. No.: 12/152,353

(22) Filed: May 13, 2008

(65) Prior Publication Data

US 2008/0283877 A1    Nov. 20, 2008

(30) Foreign Application Priority Data

May 15, 2007 (FR) .................................... 07 55080

(51) Int. Cl.
  *H01L 21/02* (2006.01)
(52) U.S. Cl. ............... 257/295; 257/288; 257/E21.208; 257/E29.164; 438/3; 438/50
(58) Field of Classification Search ............... 438/50–59, 438/3; 257/254, 288, E21.001, E29.324, 257/528, 499, E21.208, E29.164, 295
See application file for complete search history.

(56) References Cited

U.S. PATENT DOCUMENTS

| | | | |
|---|---|---|---|
| 5,883,419 A | 3/1999 | Lee et al. | |
| 6,231,779 B1 * | 5/2001 | Chiang et al. | 252/62.9 R |
| 6,599,781 B1 * | 7/2003 | Li | 438/142 |
| 2003/0015767 A1 * | 1/2003 | Emrick et al. | 257/528 |
| 2003/0092203 A1 * | 5/2003 | Murai | 438/3 |
| 2007/0018328 A1 | 1/2007 | Hierlemann et al. | |
| 2008/0290384 A1 * | 11/2008 | Lolivier et al. | 257/295 |

FOREIGN PATENT DOCUMENTS

| | | |
|---|---|---|
| EP | 1 024 540 A2 | 8/2000 |
| FR | 2 888 990 A1 | 1/2007 |

OTHER PUBLICATIONS

French Preliminary Search Report, FR 0755080, dated Nov. 16, 2007.

* cited by examiner

*Primary Examiner* — William M Brewster
*Assistant Examiner* — Wilner Jean Baptiste
(74) *Attorney, Agent, or Firm* — Nixon Peabody LLP

(57) ABSTRACT

Semiconductor device comprising at least:
  one substrate,
  a transistor comprising at least one source region, one drain region, one channel and one gate,
  a planar layer based on at least one piezoelectric material, resting at least on the gate and capable of inducing at least mechanical strain on the transistor channel, in a direction that is substantially perpendicular to the plane of a face of the piezoelectric layer situated on the gate side,
  the piezoelectric layer being arranged between two biasing electrodes, one of the two biasing electrodes being formed by a first layer based on at least one electrically conductive material such that the piezoelectric layer is arranged between this first conductive layer and the gate of the transistor.

22 Claims, 12 Drawing Sheets

US 7,973,350 B2

STRAINED-CHANNEL TRANSISTOR DEVICE

CROSS REFERENCE TO RELATED APPLICATIONS OR PRIORITY CLAIM

This application claims priority to French Patent Application No. 07 55080, filed May 15, 2007.

TECHNICAL FIELD AND PRIOR ART

The invention relates to the field of integrated circuits, and more particularly that of transistors such as MOS transistors.

One means of increasing the current $I_{ON}$, i.e. the saturation current in the on state, of MOS-type microelectronic devices consists in making good use of the mechanical strain induced by the technological processes implemented during the manufacture of the transistors in order to improve the mobility of the charge carriers (holes for PMOS transistors and electrons for NMOS transistors).

Various methods have already been developed for the purpose of placing a transistor channel under strain.

In devices fabricated using CMOS technology, nitride-based layers deposited so as to conform to the surface of the MOS transistor structure, enabling uniaxial tensile strain to be applied in the channel of an NMOS transistor, and uniaxial compressive strain in that of PMOS transistor. These strains enable the mobility of the carriers to be increased and thus proportionally increase the current $I_{ON}$ of the transistor. However, in the off state, these strains reduce the effective mass of the carriers, thereby increasing the leaking current via tunnelling, in particular when the gate length is small, and thus reducing the transistor performance in the "OFF" state, while increasing the transistor's consumption in this "OFF" state.

The document U.S. Pat. No. 5,883,419 describes an MOS transistor comprising a piezoelectric material layer deposited between the gate and channel of the transistor. The transistor channel is MoC-based, a metallic piezoresistive material, and is capable of being strained during biasing of the piezoelectric material of the gate.

In terms of speed and consumption, the performance of such a transistor is inadequate for mass applications of transistors, since it is based on a change in resistivity of the channel material and, in particular, the ratio between the saturation current and the leakage current. Furthermore, industrial production of such a transistor proves to be costly in as much as MoC is a costly material. Finally, such a device cannot be fabricated using CMOS technology.

The document FR 2 888 990 describes a microelectronic device comprising a transistor provided with a piezoelectric material layer deposited so as to conform to the surface of the MOS transistor structure, i.e., over the gate and source and drain regions of the transistor. The device is based on the application of uniaxial strain in the transistor channel, in the carrier propagation direction, thereby making it possible to obtain a strong current $I_{ON}$ and a weak current $I_{OFF}$.

However, taking into account the geometry of the device, only piezoelectric materials obtainable via deposition can be used (e.g., PZT ceramics, the piezoelectric coefficients of which are low: $d_{33} \approx 80$ pm/V and $d_{31} \approx -40$ pm/V, $d_{33}$ being a coefficient describing the deformation of the piezoelectric material in a direction that is parallel to the polarisation vector of the piezoelectric layer, i.e., the widthwise deformation, $d_{31}$ being a coefficient describing the deformation of the piezoelectric material in a direction that is orthogonal to the polarization vector of the piezoelectric layer, i.e., the lengthwise deformation). With piezoelectric materials such as this, the maximum strain capable of being obtained at the surface of the channel is, for example, less than 100 MPa for a transistor having a gate length equal to 40 nm and a piezoelectric layer thickness equal to 300 nm, which considerably limits gains in terms of increasing the current $I_{ON}$ and reducing the current $I_{OFF}$.

Furthermore, in this type of structure, the piezoelectric layer is polarised by the surfaces thereof, which are in contact with the gate conductor material, on the one hand, and with the transistor source and/or drain region, on the other hand. Thus, the electric field applied to the piezoelectric layer is maximum in the region situated in proximity to the gate oxide, and is therefore inhomogeneous in the piezoelectric layer. In order to not damage the device, the maximum value of the electric field applied in this region should remain lower than the value of the breakdown field for the piezoelectric material (e.g., for a PZT ceramic-based thin layer, $E_{breakdown} \approx 800$ kV/cm). For a difference in potential of 1 V, the electric field in the piezoelectric layer remains lower than the breakdown field thereof for oxide thicknesses greater than 12.5 nm, in the case of a PZT ceramic (minimum inter-electrode distance=1 V/800 kV.cm$^{-1}$=12.5 nm). This structure is therefore not suitable for inducing strain in the channel of MOS transistors having gate oxide thicknesses less than 10 nm.

DISCLOSURE OF THE INVENTION

Thus there is a need to propose a new MOS transistor structure having improved electric performance: an increase in the current $I_{ON}$ and a reduction in the current $I_{OFF}$ in comparison with the known devices, thereby enabling higher operating speeds for the devices and lower consumption in the OFF state, and may comprise a gate oxide the thickness of which can be below the limits imposed by the known devices, e.g., less than 10 nm.

This device is based on the application of a mechanical strain of variable intensity in the channel of an MOS transistor, irrespectively of the gate length thereof.

One embodiment relates to a new MOS transistor structure for which it is possible to vary the strain state within the channel in relation to the gate voltage. It is based on the use of a piezoelectric layer enabling a strain of variable amplitude and variable direction to be induced in the channel region of an MOS transistor.

In order to accomplish that, one embodiment proposes a semiconductor device comprising at least:
  one substrate,
  a transistor comprising at least one source region, one drain region, one channel and one gate,
  a layer based on at least one piezoelectric material, being superimposed at least over the gate and capable of inducing at least mechanical strain on the transistor channel, in a direction that is substantially perpendicular to the plane of a face of the piezoelectric layer situated on the gate side,
  the piezoelectric layer being arranged between two biasing electrodes, one of the two biasing electrodes being formed by a first layer based on at least one electrically conductive material such that the piezoelectric layer is arranged between this first conductive layer and the gate of the transistor.

Contrary to some other devices, in which the gate reduces transmission of the deformations generated within the piezoelectric layer, the piezoelectric layer, which can be planar, is placed on the upper face of the transistor gate, without being arranged directly on the source and drain regions. In this way, advantage is taken of the presence of the gate, in order to transmit the deformations generated within the piezoelectric layer to the channel, thereby making it possible to obtain strains in the channel which are greater than 100 MPa.

The piezoelectric layer is biased owing to the two electrodes between which said piezoelectric layer is situated, one electrode being formed on the piezoelectric layer, irrespectively of the dimensions of the MOS structure itself. The invention is therefore applicable for very small gate lengths and gate oxide thicknesses, which can be equal to approximately 10 nm and 0.5 nm, respectively.

The planarization of the surface of the MOS transistor structure, which is formed, in particular, by the upper face of the gate, and the fact that the piezoelectric layer is not arranged on the source and drain regions, in addition to the use of piezoelectric materials obtained by deposition, such as PZT ceramics, in order to form the piezoelectric layer, enables the use of adhesion-transferred thin-layer single-crystal piezoelectric materials. This widens the choice of piezoelectric materials for fabricating the structure. Furthermore, some single-crystal piezoelectric materials have very high piezoelectric coefficients, as in the example of PMN-PT and/or PZN-PT ($d_{33}$(PMN-PT)≈2404 pm/V). The use of piezoelectric materials with very high piezoelectric coefficients has the advantage of increasing the strain levels obtained in the channel and of thereby improving the performance of transistor.

The use of a piezoelectric layer as a deformation generator enables a strain state of variable direction and amplitude to be induced within the channel, which is controlled, respectively, by the sign and value of the bias applied to the terminals of the piezoelectric layer, which can advantageously be the same as that applied to the gate. The voltage intended to be applied to the transistor gate can be similar to the voltage intended to be applied to the piezoelectric layer.

The piezoelectric layer and/or the first conductive layer can be planar.

The dimensions of the faces of the electrodes in contact with the piezoelectric layer can be greater than or equal to the dimensions of the faces of the piezoelectric layer in contact with the electrodes. Thus, the electric field created by the voltage applied to the biasing electrodes, between which the piezoelectric layer is situated, is uniform throughout the entire piezoelectric layer. This uniform electric field involves a uniform degree of strain, which is then applied throughout the entire channel by the piezoelectric layer.

In a first alternative, the other of the two biasing electrodes can be formed by the transistor gate.

In a second alternative, the other of the two biasing electrodes can be formed by a second layer based on at least one electrically conductive material arranged between the piezoelectric layer and the transistor gate.

In this case, the device can further comprise a dielectric layer arranged between the gate and the second layer based on a conductive material. This dielectric layer makes it possible to insulate the biasing electrode, which is formed by second conductive layer, from the transistor gate, thereby enabling independent control of the transistor (by means of the gate) and the piezoelectric layer (by means of the biasing electrodes).

The first conductive layer, and/or the second conductive layer, when the device comprises a second conductive layer, can be substantially planar and parallel to the piezoelectric layer.

In the device, the rigidity of the gate stack can be put to profit: it can assist in transmitting the deformation generated by the piezoelectric layer to the surface of the channel. As a matter of fact, when the transistor gate length $L_g$ is reduced, the person skilled in the art tends to replace a gate having low rigidity, based on polysilicon, for example, with a more rigid metal gate, based on TiN, for example (E(TiN)≈290 GPa, and E(Si)≈130 GPa, with E being the stiffness coefficient of the material or Young's modulus). This rigidity can be very detrimental in the case where the piezoelectric layer is deposited so as to conform to the surface of the transistor (over the gate and source and drain regions), as described in the document FR 2 888 990, because it stands in opposition to transmission of the deformations. In the device, deformation is generated by the piezoelectric layer in a direction which, for the most part, is substantially perpendicular to the plane in which is situated the piezoelectric layer situated on the gate side. The strain induced is therefore a uniaxial strain in this direction, which, in the channel region, is equivalent to a biaxial strain in a plane parallel to the plane of the face of the piezoelectric layer situated on the gate side. The impact of the gate on the transmission of deformations is different. In the case of a deformation transmitted in the direction substantially perpendicular to the plane in which is situated the face of the piezoelectric layer situated on the gate side, the rigidity of the gate enables the channel situated beneath the gate stack to be deformed more heavily, whereas, in the case of a deformation transmitted in a direction situated in said plane of said face of the piezoelectric layer, as is the case for the device described in FR 2 888 990, the rigidity of the gate reduces deformation of the channel.

The rigidity of the conductive layers forming the electrodes can likewise be put to profit: based on the direction of the deformations, along an axis which is substantially perpendicular to the plane of the face of the piezoelectric layer situated on the gate side, they assist, in a way similar to the gate, in transmitting the deformations generated in the piezoelectric layer to the gate. The conductive layer or layers may be based on molybdenum and/or platinum. In the case of a piezoelectric layer which is deposited so as to conform to the surface of the transistor and biased by horizontal electrodes based on a material such as molybdenum or platinum, which is very rigid in comparison with the silicon of the channel (E(Mo)≈320 GPa, E(Pt)≈276 GPa while E(Si)≈130 MPa), these electrodes anchor the entire surface of the transistor. The lower electrode thus acts as a barrier to the transmission of deformations generated in one direction within the plane of the face of the piezoelectric layer situated on the gate side. It concentrates the deformations within itself, which are only very slightly transmitted to the surface of the channel. It is therefore difficult to induce strain within the channel.

Owing to the structure according to one embodiment, the strain induced can be localized beneath the gate, and more precisely in proximity to a dielectric gate/substrate interface which corresponds to the channel inversion region according to the mode of operation of a MOS transistor. This involves the carrier transport region and therefore that wherein the strain can be applied most heavily, in order to take maximum advantage of the effects thereof on the electric performance of the transistor.

When the lower biasing electrode of the piezoelectric material, i.e., the conductive layer situated between the piezoelectric layer and the substrate, is in contact with the gate over the entire width thereof (the width corresponding to the direction transverse to the channel), the resistivity of the gate can be reduced, which means that the time for biasing the gate over the entire width thereof, and thus the transistor operating time, can be reduced.

The structure of the device likewise facilitates the mechanical operation thereof and corresponds to a standard MOS transistor manufacturing method.

The semiconductor device can further comprise at least one portion based on at least one dielectric material arranged on the substrate and beside the gate, covering at least one portion of the source or drain region, while the piezoelectric layer also rests on this dielectric portion.

The semiconductor device can further comprise a second portion of at least one dielectric material arranged on the substrate and beside the gate, on which the piezoelectric layer can rest, while the drain and source regions are capable of being at least partially covered by the dielectric portions.

The device according one embodiment makes advantageous use of the dielectric portion or portions, based on $SiO_2$, for example, on both sides of the gate, because $SiO_2$ is a mechanically non-rigid material. The longitudinal deformation mode of the piezoelectric layer is thereby facilitated, because the vertical edges thereof are free to deform as much as possible.

In addition, the upper surface of the piezoelectric layer may be advantageously anchored as rigidly as possible so that the deformations are preferably transmitted downward, on the transistor side, and not to the materials situated above the piezoelectric layer. This condition may be obtained intrinsically when the interconnection layers are numerous (which is the case in complex circuits comprising as many as 10 layers of metal), and may be facilitated experimentally by depositing a layer serving as an upper electrode, which may be based on a very rigid material, e.g., platinum or molybdenum.

Finally, this device makes advantageous use of the longitudinal deformation mode of the piezoelectric material, which is an advantage from a method standpoint, as compared to the production of vertical electrodes, which can be advantageously used in order to make good use of the transverse deformation mode of the piezoelectric material. As a matter of fact, in the case of horizontal electrodes, i.e., within the plane of the face of the piezoelectric layer situated beside the gate, comprising a thin conductive layer that can be obtained via deposition, growth, transfer . . . , the dimensioning of the electrodes can be better controlled than in the case of vertical electrodes, which pose problems during vertical etching of the material comprising the electrodes.

The semiconductor device may further comprise a dielectric layer arranged between the gate and the piezoelectric material.

The transistor may advantageously be of the MOS type.

The substrate may comprise a layer based on a semiconductor material upon which are stacked a dielectric layer and an active layer based on a semiconductor material.

The substrate may comprise a cavity which is formed at least beneath the transistor channel.

The cavity may be filled with at least one material the stiffness of which can be less than that of the substrate material.

The gate may be based on polysilicon and/or titanium nitride and/or tantalum nitride.

The stiffness of the gate material may be greater than the stiffness of the material of the dielectric portion or portions.

The ratio of the stiffness of the gate material to the stiffness of the material of the dielectric portion or portions may be greater than 1, and, for example, between approximately 2 and 5.

When the piezoelectric layer is arranged between two conductive layers, the stiffness of the material of the conductive layers may be greater than the stiffness of the material of the dielectric portions.

The piezoelectric layer may be symmetrical in relation to a first plane, which is substantially perpendicular to the plane of the face of the piezoelectric layer situated on the gate side, while the gate may be symmetrical in relation to a second plane, which is substantially perpendicular to said plane of the face of the piezoelectric layer situated on the gate side, the first and second planes may having the capability of being superimposed over or offset in relation to one another.

Another embodiment also relates to a method for fabricating a semiconductor device comprising at least the steps of:
 fabricating a transistor comprising at least one source region, one drain region, one channel and one gate on a substrate,
 depositing a layer based on at least one piezoelectric material over at least the gate, the piezoelectric layer being capable of inducing at the very least mechanical strain on the transistor channel, in a direction which is perpendicular to the plane of a face of the piezoelectric layer situated on the gate side,
 depositing a layer based on at least one electrically conductive material forming a first biasing electrode, such that the piezoelectric layer is arranged between this conductive layer and the transistor gate,
 the piezoelectric layer also being arranged on a second biasing electrode.

Between the step of fabricating the transistor and the step of depositing the piezoelectric layer, the method may further comprise a step of depositing another layer based on at least one electrically conductive material over at least the gate, the piezoelectric layer then may have the capability of being deposited on this other conductive layer forming the second biasing electrode.

Prior to the step for depositing the other layer based on an electrically conductive material, the method may further comprise a step for depositing a dielectric layer on the gate, said other layer based on an electrically conductive layer being deposited on the dielectric layer.

In one alternative, between the step of fabricating the transistor and the step of depositing the piezoelectric layer, the method may further comprise a step for producing the piezoelectric layer and another layer based on at least one electrically conductive material, via ion implantation on a substrate based on a piezoelectric material comprising said other conductive layer on one of the faces thereof, and by cleaving in the vicinity of the implantation made in the substrate, said other conductive layer may have the capability of being deposited against the gate during the step of depositing the piezoelectric layer.

Prior to the step of fabricating the transistor, the method may further comprise a step of making a cavity in the substrate, which is intended to be arranged beneath the transistor channel.

The cavity may be made by implementing the following steps:
 deposition of a first layer onto the substrate and of a second layer, based on a material similar to that of the substrate, onto the first layer, the first layer being based on a material capable of being etched selectively with respect to the materials of the substrate and the second layer,
 anisotropic etching of the first and second layers, such that the pattern formed by the remaining portion of the first layer is substantially similar to the pattern of the cavity, and which stops at the substrate level,
 epitaxy of the substrate material such that the substrate and the second layer form an active layer of the substrate which encapsulates the remaining portion of the first layer, creation of an opening in the active layer for accessing the remaining portion of the first layer, selective etching of the material of the remaining portion of the first layer, thus forming the cavity.

When the substrate is of the semiconductor-on-insulator type, and after the step for selective engraving of the material of the remaining portion of the first layer, the method may further comprise the additional steps of:

oxidation of the cavity walls, selective etching of the oxide formed on the walls, such that a portion of the substrate insulator forms a wall of the cavity.

After creation of the cavity, the method may further comprise a step for filling the cavity with at least one material the stiffness of which is less than that of the substrate material.

Between the step of fabricating the transistor and the step of depositing the piezoelectric layer, the method may further comprise a step of depositing onto the substrate at least one portion based on at least one dielectric material capable of covering at least a portion of the source and drain region, next to the gate, the piezoelectric layer then may have the capability of being deposited over the dielectric portion.

Between the step of fabricating the transistor and the step of depositing the piezoelectric layer, the method may further comprise a step of depositing at least one resin-based portion, and a step of removing this resin portion after deposition of the piezoelectric layer over the gate and resin portion.

BRIEF DESCRIPTION OF THE DRAWINGS

This invention will be best understood upon reading the description of exemplary embodiments, which are provided for purely illustrative and strictly non-limiting purposes, and by referring to the appended drawings, in which.

Identical, similar or equivalent portions of the various figures described below carry the same numerical references so as to facilitate passing from one figure to another.

The various portions represented in the figures are not necessarily at a uniform scale, so as to make the figures more legible.

The various possibilities (alternatives and embodiments) should be understood as being mutually non-exclusive and can be combined with one another.

DETAILED DISCLOSURE OF PARTICULAR EMBODIMENTS

Figure 1:
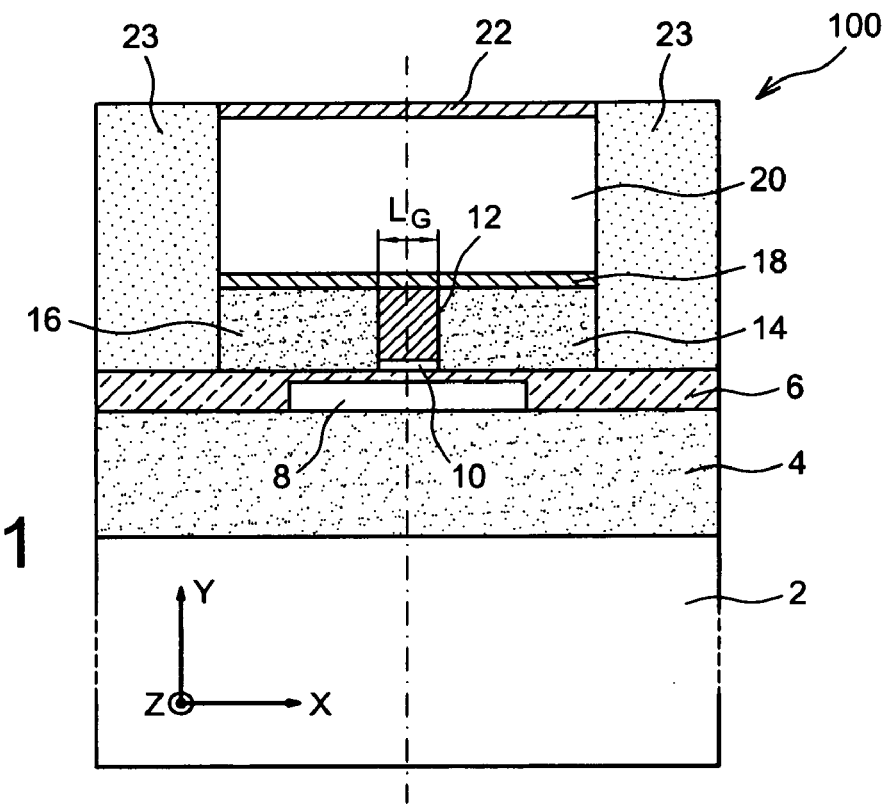
FIGS. 1 to 3 represent semiconductor devices having a strained-channel transistor according to a first, second and third embodiment, respectively.

Reference is made first of all to FIG. 1, which represents a semiconductor device 100 comprising a strained-channel MOS transistor in SOI technology (silicon-on-insulator).

The device 100 comprises a substrate 2 based on a semiconductor material, which, in this case is single-crystal silicon. A dielectric layer 4, based on $SiO_2$, for example, covers the substrate 2, and is itself covered by a semiconductor layer 6 capable of acting as an active, silicon-based layer, for example. The substrate 2 and layers 4 and 6 form a semiconductor-on-insulator type substrate, in this case SOI (silicon-on-insulator), upon which an MOS transistor is fabricated.

The active layer 6 may also be based on Si, and/or Ge, and/or SiGe, and/or GaAs. A portion of the face of the active layer 6 situated on the side of the dielectric layer 4 is thinned out at the middle thereof, over a length less than $L_1$, $L_1$ being the dimension of layers 2, 4 and 6, along an x-axis shown in FIG. 1. This thinned-out portion thus forms a cavity 8, which is left empty in this case (without any material inside) so as to later maximize strain relief for the transistor channel of the device 100 via the lower surface thereof.

The active layer 6 is covered by a dielectric gate 10 surmounted by a gate 12 of the MOS transistor. The MOS transistor also comprises source and drain regions and a channel, which are not shown in FIG. 1, and which are made in the active layer 6. The gate dielectric 10 is arranged above the channel. In addition, the channel is fabricated above the cavity 8. The gate dielectric 10, for example, is based on $SiO_2$ and/or a high-permittivity material, e.g., $HfO_2$. The gate material 12 is a conductor, e.g., polycrystalline silicon, and/or metal such as TiN and/or TaN, and/or a bilayer comprising a polysilicon-coated layer of metal. The dimension $L_G$ of the gate dielectric 10 and of gate 12 along the x-axis, corresponds to the transistor gate length.

Dielectric portions 14 and 16, based on $SiO_2$, for example, are deposited on both sides of this gate stack. These dielectric portions 14 and 16 have a thickness equal to the sum of the thicknesses of the gate dielectric 10 and gate 12. In this case, the material of gate 12 has a degree of stiffness greater than that of the material of the dielectric portions 14 and 16. For example, when gate 12 is based on polycrystalline silicon, the stiffness, referenced as E (Polycrystalline Si) is equal to approximately 130 GPa, and when gate 12 is based on TiN, then E(TiN) is equal to approximately 290 GPa. When the dielectric portions 14 and 16 are based on $SiO_2$, then $E(SiO_2)$ is equal to approximately 66 GPa. The stiffness ratio obtained, $$\frac{E(\text{gate})}{E(\text{dielectric portions})}$$

for example, is between approximately 2 and 5.

The upper faces of gate 12 and the dielectric portions 14 and 16, i.e. the face opposite the one situated in contact with the active layer 6, for the dielectric portions 14 and 16, and a face opposite the one situated in contact the gate dielectric 10, for gate 12, are situated at the same level, i.e., situated in a single plane.

Gate 12 and the dielectric portions 14 and 16 are covered by a three-layer stack: a first conductive layer 18, a layer 20 based on a piezoelectric material and a second conductive layer 22. The conductive layers 18 and 22 serve as lower and upper electrodes, respectively, for biasing the piezoelectric material of layer 20. The material of the conductive layers 18 and 22, for example, can be molybdenum and/or platinum, the choice of this material being dependent on the nature of the piezoelectric material used in layer 20. In addition, the stiffness of the material of the conductive layers 18 and 22 is, in this case, greater than that of the dielectric material of the dielectric portions 14 and 16. For example, for layers 18 and 22, E(Mo)≈320 GPa, E(Pt)≈276 GPa, and, for the dielectric portions 14 and 16, E(SiO2)≈66 GPa. The piezoelectric material of layer 20, for example, can be a material having a high piezoelectric coefficient, such as PMN-PT and/or PZN-PT.

Layers 18, 20 and 22, as well as the assembly comprising the gate dielectric 10, gate 12 and the dielectric portions 14 and 16, are of the same length L2, which is less than L1, along the x-axis shown in FIG. 1. Additionally, the piezoelectric layer 20 and the conductive layers 18 and 22 are centred in relation to the axis or plane of symmetry of the MOS transistor, which passes through the middle of gate 12, between the source and drain regions. Portions 23, based on a dielectric material, e.g., $SiO_2$, are deposited on the active layer 6, on both sides of the stack comprising of layers 18, 20 and 22, the gate dielectric 10, gate 12 and the dielectric portions 14 and 16.

According to the principle of the inverse piezoelectric effect, when a piezoelectric material is exposed to an outside electric field, it becomes deformed. To deform the piezoelectric material of layer 20, a difference in potential is applied between the two electrodes thereof 18 and 22, thereby biasing the piezoelectric layer. In device 100, gate 12 is in contact with the lower electrode 18. The upper electrode 22 is electrically connected to the source of the transistor. Biasing of the piezoelectric layer 20 is therefore linked to the operation of the MOS transistor. Deformation of the piezoelectric material 20 is thus slaved to the gate voltage of the transistor. Depending on the sign of the gate 12 bias, the piezoelectric layer 20 is stretched or compressed, primarily in the direction of the y-axis shown in FIG. 1, according to the configuration of the piezoelectric layer 20/horizontal biasing electrodes 18 and 22 stack. The deformations generated within the piezoelectric layer 20, along the y-axis, are transmitted throughout the entire structure of the device 100. The active layer 6, and therefore the transistor channel, is thereby strained biaxially in the plane perpendicular to the y-axis, i.e., a plane parallel to the plane (x, z).

The piezoelectric effect becomes proportionally greater the larger the surface area of the piezoelectric layer opposite the biasing electrodes. In order to obtain, in the transistor channel, advantageous strain amplitude in terms of an electrical performance gain for the device, the piezoelectric effect produced by the piezoelectric layer must be adequate. Advantageously, the length of the assembly comprising the piezoelectric layer and the biasing electrodes thereof is adapted according to the electromechanical characteristics of the material of the piezoelectric layer. In the example of FIG. 1, the length of the upper electrode 22, along the x-axis, is equal to the length of the piezoelectric layer 20. Furthermore, in this exemplary embodiment, the length of the piezoelectric layer is greater than $L_G$. Considering this difference in length, the presence of the lower electrode 18 enables the piezoelectric layer 20 to be biased over the entire length thereof.

In one alternative embodiment, if the length of the piezoelectric layer 20, along the x-axis shown in FIG. 1, which is equal to the length of the upper electrode 22, is less than $L_G$, then the device 100 may not comprise any lower electrode 18. In this case, the piezoelectric layer 20 is arranged directly over the gate 12, which acts as the lower biasing electrode of the piezoelectric layer 20. The piezoelectric layer 20 is thereby biased over the entire length thereof.

This applied strain makes it possible to increase the MOS transistor current $I_{On}$ and to reduce the current $I_{OFF}$. The influence of the strain on the value of the currents depends on the type of carriers, electrons or holes involved. In the case of an NMOS transistor, in which the charge carriers are electrons, in the on state, i.e., when the gate voltage $V_G$ is positive and non-zero, e.g., equal to approximately 1 V, the piezoelectric layer 20 is compressed in the direction y and places the transistor channel under biaxial strain. The mobility of the carriers, and thus the current $I_{ON}$, are thereby increased. In the off state, i.e., when the gate voltage $V_G$ is zero, the piezoelectric layer 20 stretches in the direction y and places the transistor channel under biaxial compression. The mobility of the carriers, and thus the current $I_{OFF}$ are thereby reduced.

In the case of a PMOS transistor in which the charge carriers are holes, placing the channel under compression results in an increase of the current $I_{ON}$ in the on state and, placing the channel under strain results in a reduction in the leakage current in the off state.

In order to eliminate parasitic phenomena associated with the cavity 8, for example the effects of thermal heating or the concentration of impurities on the various edges of this cavity 8, the cavity 8 can be filled with a material the stiffness of which is lower than that of the material of the active layer 6, thereby having better properties than the void, as concerns the various parasitic phenomena mentioned above. This material, for example, can be $SiO_2$, and/or a porous material and/or an SOG (spin-on glass) material.

In another alternative, gate 12 of the device 100 can be insulated from the lower electrode 18 by a dielectric layer. By insulating the lower electrode 18 from the gate 12, it is possible to control the strain state of the piezoelectric layer 20, and thus that of the active layer 6, irrespectively of the operation of the MOS transistor. The device then has four operating modes which differ by the electric performance of the device:

increased current $I_{ON}$ and reduced current $I_{OFF}$,
increased current $I_{ON}$ and unchanged current $I_{OFF}$,
unchanged current $I_{ON}$ and reduced current $I_{OFF}$,
current $I_{ON}$ and current $I_{OFF}$ unchanged.

This possibility of controlling the performance of the device irrespectively of the operation of the MOS transistor is particularly advantageous when the semiconductor device comprises several transistors, enabling the leakage currents, for example, to be increased in one branch of a circuit and to reduce them in another.

Figure 2:
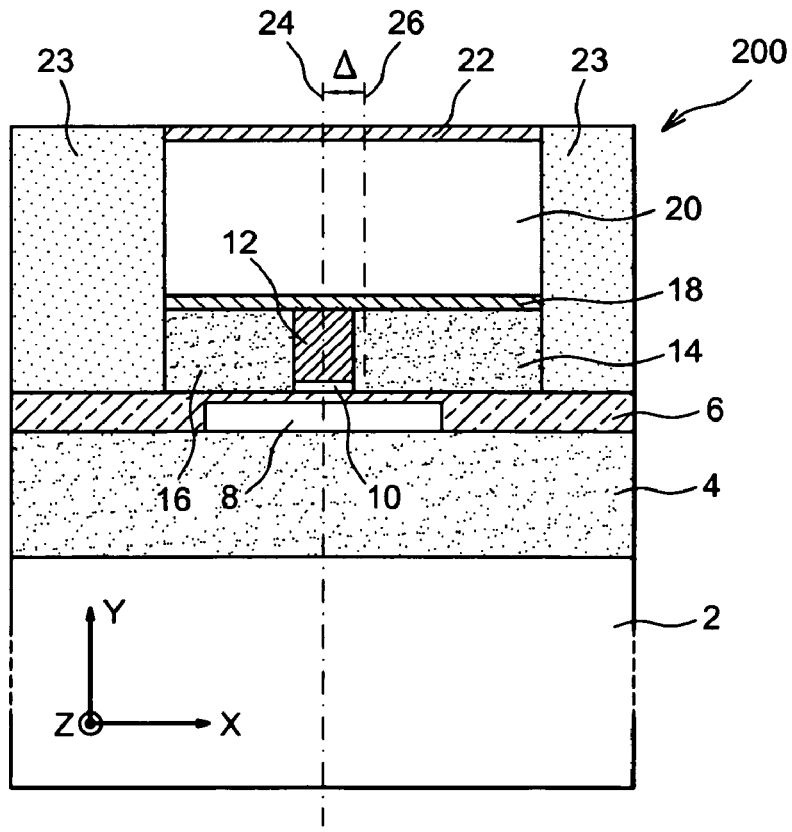

Reference will now be made to FIG. 2, which represents a semiconductor device 200 comprising a strained-channel MOS transistor according to a second embodiment.

In comparison with the device 100 of the first embodiment, the piezoelectric layer 20 as well as the conductive layers 18 and 22 are offset in relation to an axis of symmetry 24, or plane of symmetry, of the MOS transistor. In FIG. 2, it can be seen that the axis of symmetry 26, or a plane of symmetry, of layers 18, 20 and 22 is off-centre at a distance Δ in relation to the axis of symmetry 24, or plane of symmetry, of the MOS transistor. In the direction of the x-axis shown in FIG. 2, the distance Δ can be considered to be positive or negative in relation to the axis of symmetry 24 of the MOS transistor, i.e., the layers 18, 20 and 22 can be off-centre on one side as well the other, in relation to the MOS transistor. This misalignment enables positioning of the piezoelectric stack comprising layers 18, 20 and 22, so as to maximize the transmission of the deformations of the piezoelectric layer 20 to the active layer 6. As a matter of fact, the stiffness anisotropy of certain piezoelectric materials (e.g., PMN-PT) induces a non-uniform deformation field there within. The misalignment of the piezoelectric stack makes it possible to place the gate 12 such that strain is the highest and most uniform as possible in the transistor channel. This misalignment likewise means that the dielectric portions 14 and 16 are not of the same length (dimension along the x-axis shown in FIG. 2), the dielectric portion 14 having a greater length than that of the dielectric portion 16 in the example of FIG. 2.

With the assistance of a mechanical simulation software program, the effects of the misalignment can be quantified by using the distance Δ as a variable. An example is provided in the case where the piezoelectric material is single-crystal PMN-PT and with the following parameters:

$L_1$=600 nm,
thickness of gate 12=50 nm,
$L_G$=40 nm,
thickness of the gate dielectric 10=3 nm,
thickness of the piezoelectric layer 20=100 nm,
$L_2$=300 nm
thickness of the conductive layers 18 and 22=10 nm,
thickness of the active layer 6=40 nm,
thickness of the cavity 8 filled with $SiO_2$=30 nm,
thickness of the dielectric layer 4=140 nm,
thickness of the substrate 2=600 nm.

For such dimensions, the level of strain registered at the surface of the channel, in the region situated beneath the gate stack, varies between 402 MPa and 519 MPa, namely a strain variation of 117 MPa in the case of zero alignment (Δ=0), and between 396 and 503 MPa, namely a variation of 107 MPa in the case of a misalignment Δ=10 nm, thereby minimizing the non-uniform characteristic of the strain within the channel.

Figure 3:
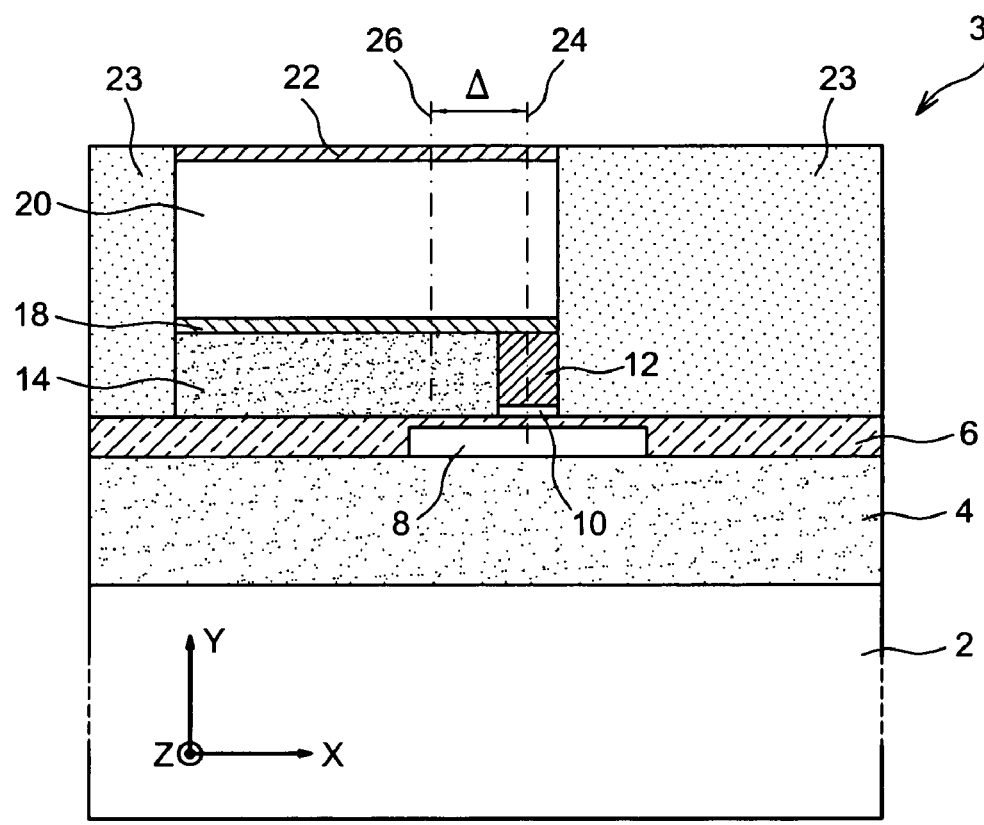

Reference is now made to FIG. 3, which represents a semiconductor device 300 comprising a variably strained-channel MOS transistor according to a third embodiment.

The assembly of layers 18, 20 and 22 is in this case in contact with the upper face of the gate 12 but surmounts only the source region of the transistor which, in this example, is situated on the left side of the gate stack. This dissymmetrical arrangement of the piezoelectric stack of layers 18, 20 and 22, in relation to the gate 12 of the transistor, can be utilized in order to shear deform the transistor channel. The strain within the channel will then be very non-uniform. Furthermore, in this case, only one dielectric portion, here dielectric portion 14, is arranged next to the gate stack.

In the same way, it is possible to place the piezoelectric stack so that it is next to gate 12 but so that it surmounts only the drain region of the transistor. The effects on the channel will be of the same type.

With the assistance of a mechanical simulation software program, the effects of the misalignment can be quantified by incrementing the distance Δ, representing the distance separating the axis of symmetry 24 of the transistor and the axis of symmetry 26 of the piezoelectric stack, Δ being, in the third embodiment, equal to approximately one half-length of the piezoelectric layer 20, from one simulation to the next. For example, in the case where the piezoelectric material is single-crystal PMN-PT and when the dimensions are similar to those of the previously simulated example in relation to FIG. 2, the level of strain recorded at the surface of the channel, in the region situated beneath the gate, varies between approximately −40 MPa and +95 MPa, in the case of zero misalignment (Δ=0), and between 70 and 287 MPa in the case of a misalignment Δ=130 nm. According to these results, without any misalignment, the channel is under compression on one side and under strain on the other. In this case, the introduction of a misalignment equal to approximately 130 nm enables obtainment of a single strain state in the channel (the strain is always positive).

In all of the previously described embodiments, since the surface of the MOS transistor structure formed by the upper faces of the gate 12 and by the insulating portion or portions 14, 16 is planar, it is possible to use adhesion-transferred, thin-layer single-crystal piezoelectric materials to form the piezoelectric layer 20, in addition to the use of piezoelectric materials obtained via deposition. This widens the choice of piezoelectric materials for fabricating the structure. Furthermore, some single-crystal piezoelectric materials have very high piezoelectric coefficients, as in the example of PMN-PT and/or PZN-PT ($d_{33}$(PMN-PT)≈2404 pm/V), in comparison with the thin films obtained via deposition: $d_{33}$(PZT ceramic thin films)≈80).

A method for fabricating a semiconductor device 100 according to a first embodiment will now be described in connection with FIGS. 4A to 4O.

Figure 4A:
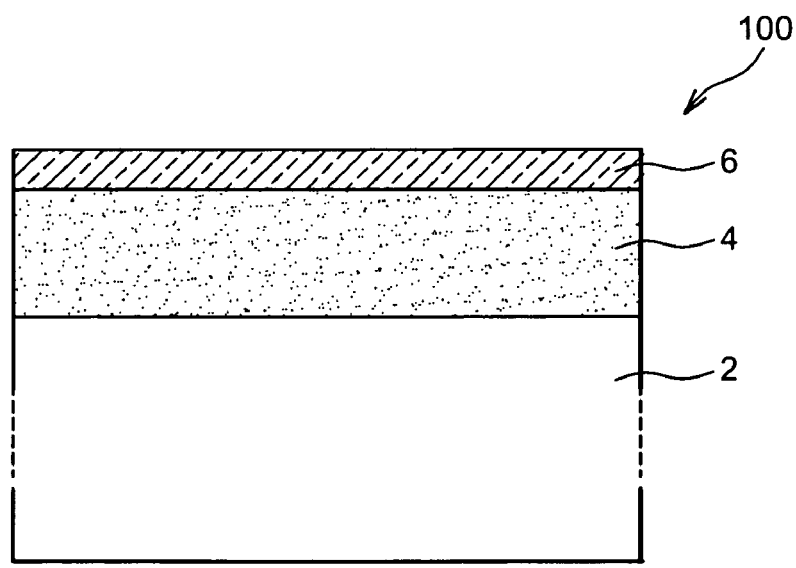
FIGS. 4A to 4O represent the steps of a method for fabricating a semiconductor device having a strained-channel transistor according to a first embodiment.

As shown in FIG. 4A, an SOI substrate is first formed from substrate 2, a dielectric layer 4 and a semiconductor active layer 6 which, in this case, based on silicon, having a thickness of approximately 5 nm, for example.

Figure 4B:
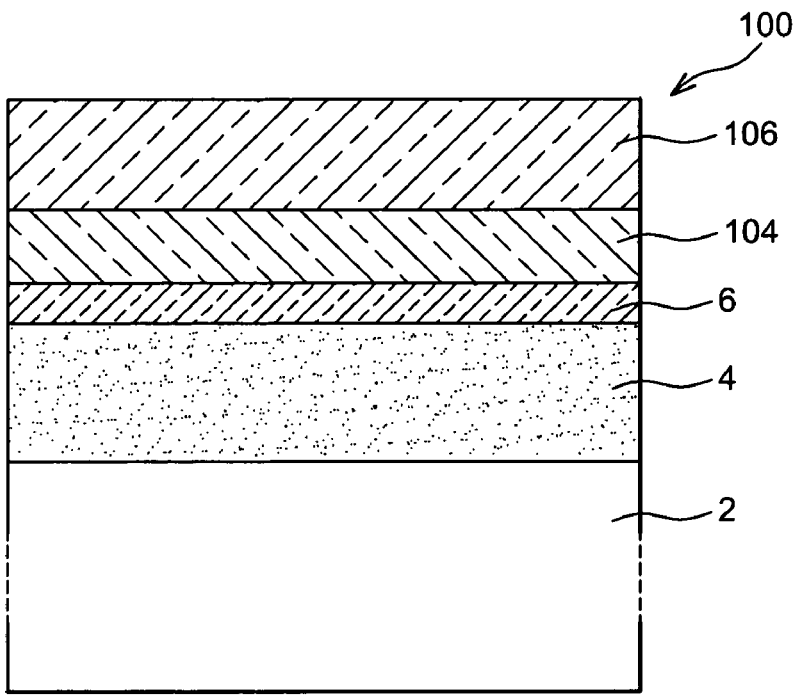

Next, a layer 104 and then a layer 106 are successively deposited on the active layer 6. Here, the material of layer 106 is similar to that of the active layer 6 (FIG. 4B). The material of layer 104 is chosen such that it can be etched selectively in relation to the material of layers 6 and 106, e.g., SiGe. The thickness of layer 104, for example, is equal to approximately 20 nm, that of layer 106, for example, being equal to approximately 15 nm.

Figure 4C:
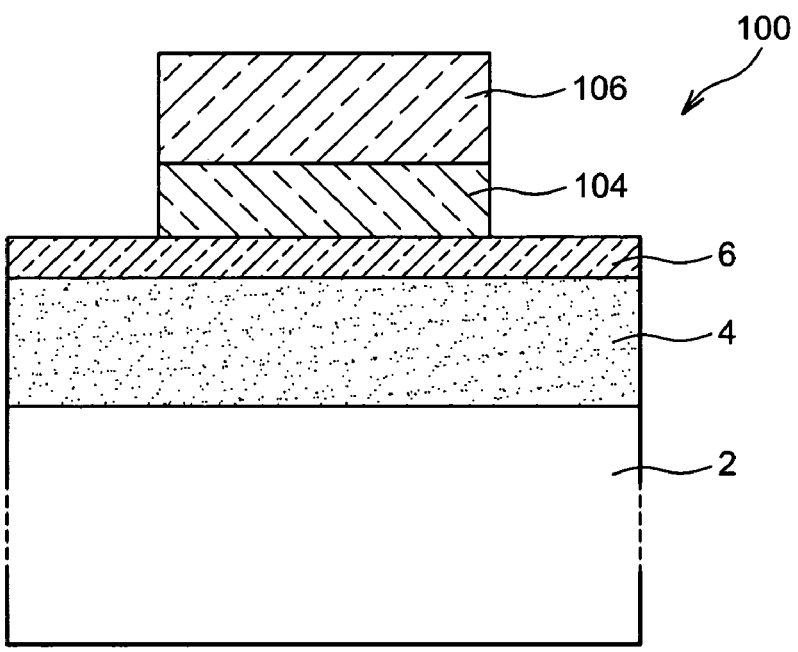
Figure 4D:
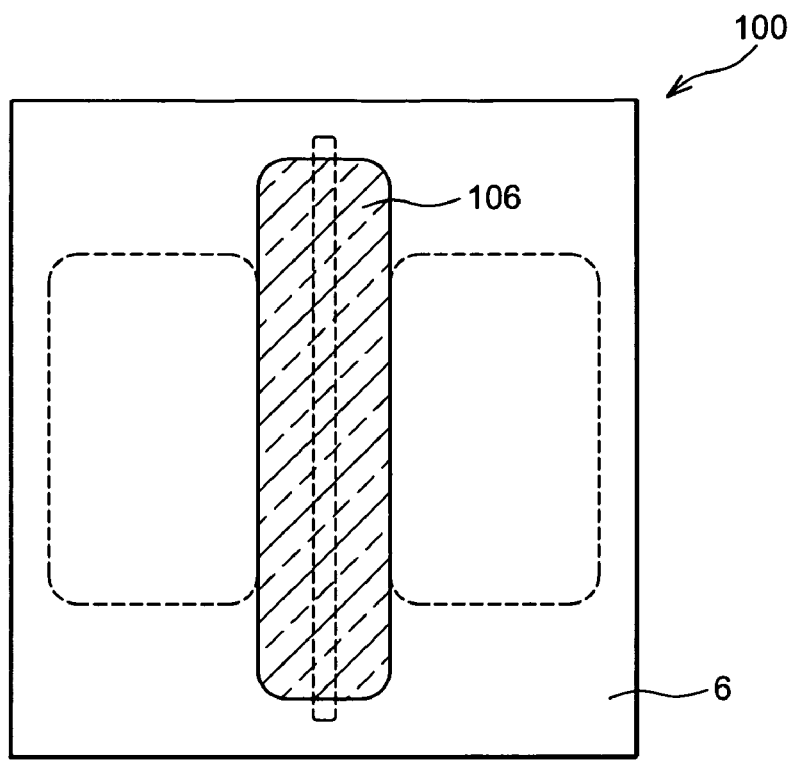

Vertical anisotropic etching of layers 104 and 106 is then carried out, so as to form portions of layers 104 and 106 the shape of which is substantially similar to that of the cavity 8 intended to be formed in the device 100, but of somewhat smaller dimensions than those of the future cavity 8 (FIGS. 4C and 4D, FIG. 4D being a top view).

Figure 4E:
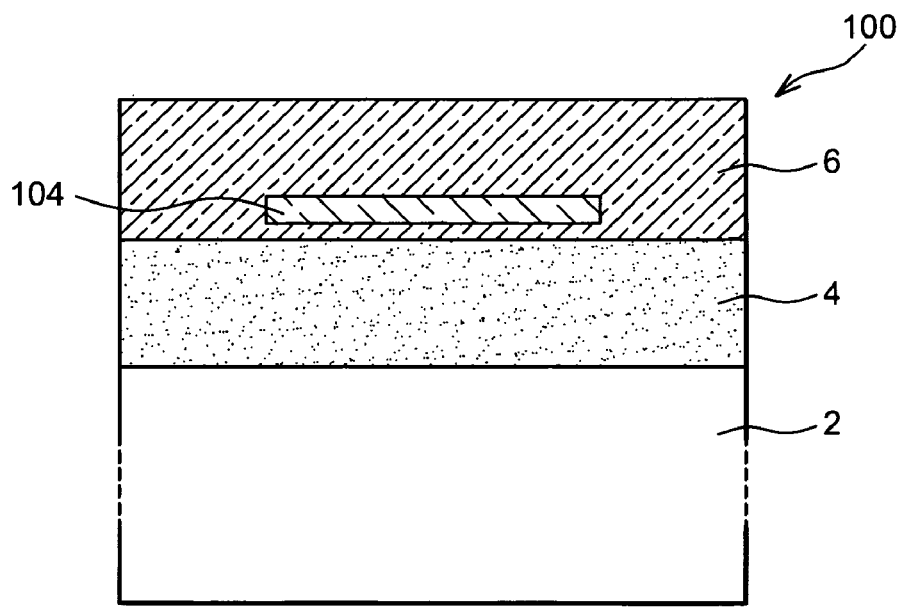

As shown in FIG. 4E, silicon epitaxy is carried out with layer 6, so that the remaining portion of the SiGe layer 104 is completely surrounded by the silicon of the active layer 6.

Figure 4F:
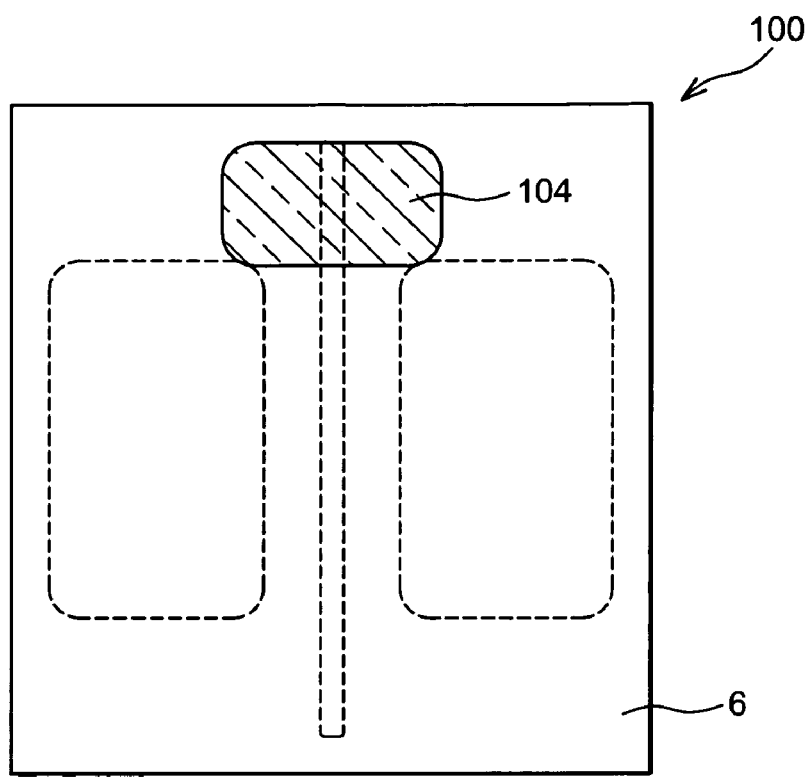
Figure 4G:
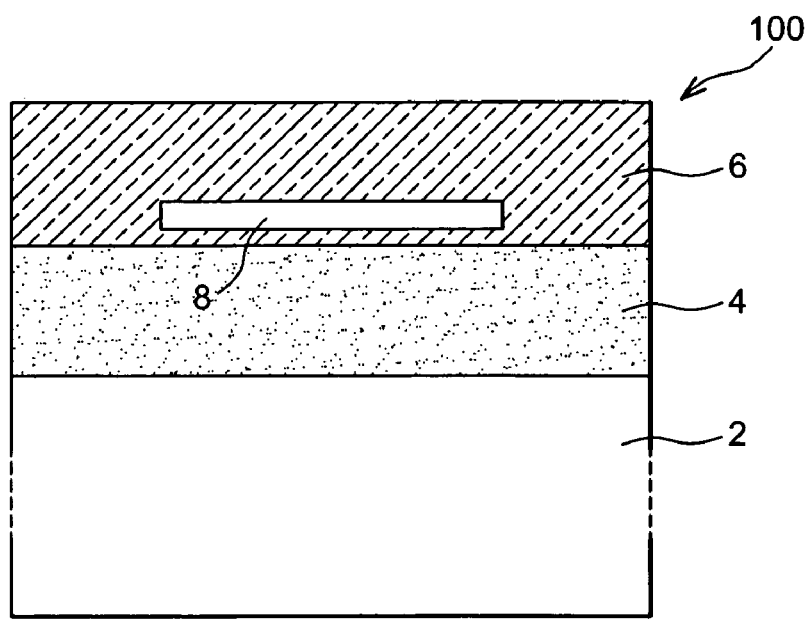

An opening is then etched into the active layer 6, enabling access to the SiGe layer 104 (FIG. 4F). The SiGe portion of layer 104 is then selectively etched through the previously made opening, thereby forming a void cavity 8 in the silicon active layer 6 (FIG. 4G).

Figure 4H:
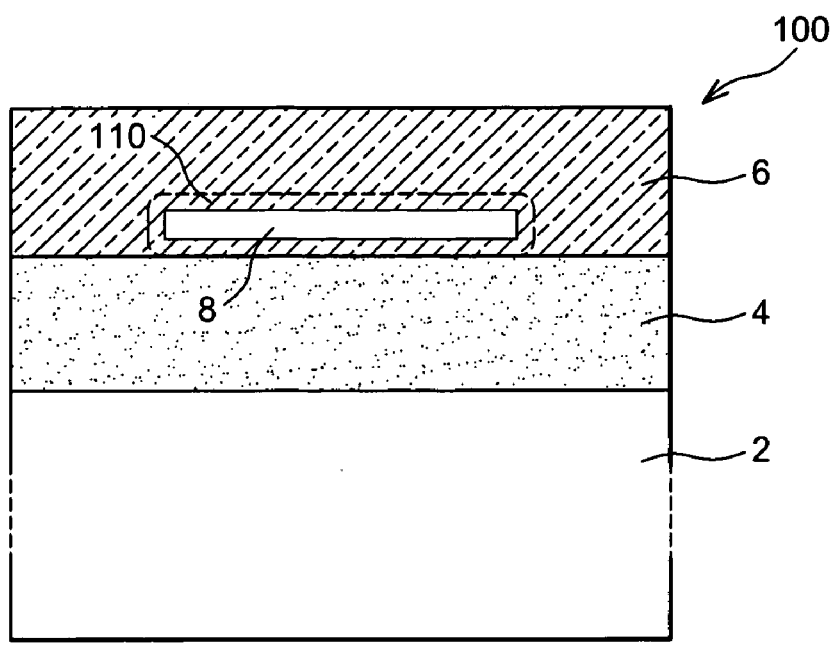

Next, the silicon of the cavity 8 walls 110 are then oxidized (FIG. 4H). This oxidation is carried out at least such that the silicon portion of the active layer 6 situated between the cavity 8 and the oxide layer 4 is completely oxidized.

Figure 4I:
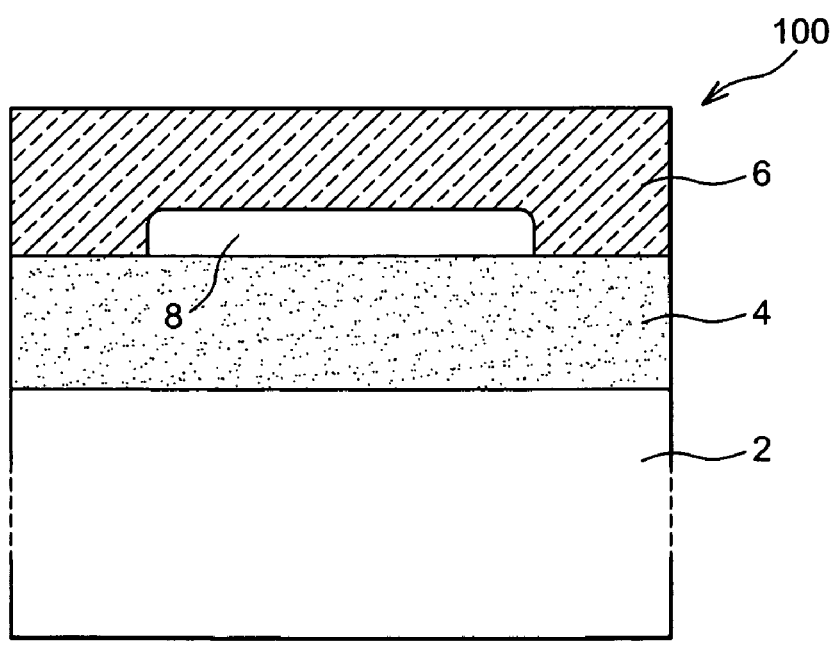

As shown in FIG. 4I, the silicon oxide 110 formed in the cavity 8 is eliminated by selectively etching in relation to the silicon of the active layer 6. The cavity 8 is formed in this way. In FIG. 4I, it is seen that one wall of the cavity 8 is formed by a portion of the dielectric layer 4.

Figure 4J:
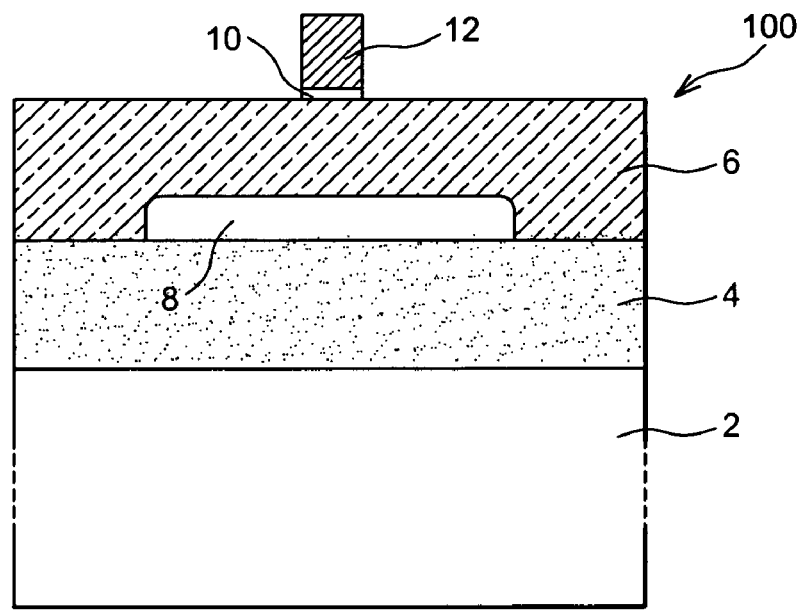

As shown in FIG. 4J, an MOS transistor is then fabricated, which comprises an active region including a source region, a drain region and a channel, which are made in the active layer 6. The channel of this MOS transistor is made above the cavity 8. A gate dielectric 10 as well as a gate 12 are made on the transistor channel.

Figure 4K:
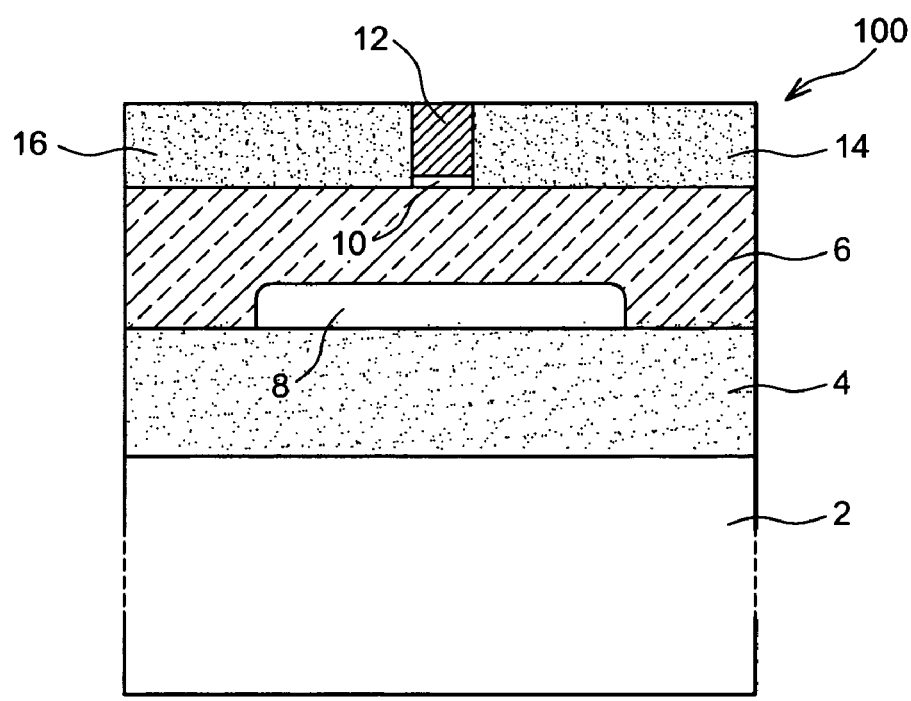

A dielectric layer is then deposited on the active layer 6 and on the gate 12. Planarization of this dielectric layer is then implemented, stopping at the gate 12 level, such that the surface of this dielectric layer is level with the upper face of the gate 12. In this way, the dielectric layer forms dielectric portions 14 and 16 (FIG. 4K) on both sides of the gate stack.

In one alternative, the dielectric layer can be replaced by a resin layer, thus forming resin portions on both sides of the gate 12, which replace the dielectric portions 14 and 16.

Figure 4L:
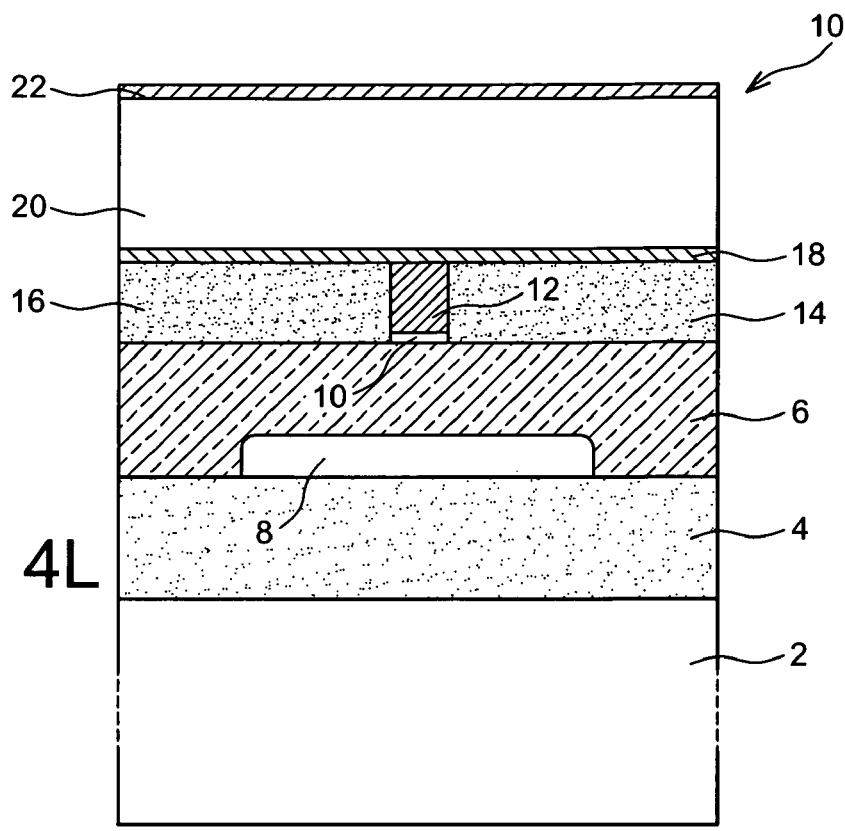

In FIG. 4L, successive depositions are then made comprising the conductive layer 18 forming the lower electrode of the piezoelectric stack, the piezoelectric layer 20 and the conductive layer 22 forming the upper electrode of the piezoelectric stack.

Next, portions of the piezoelectric stack 18, 20 and 22 and the dielectric portions 14 and 16 not situated above the cavity 8 (FIG. 4M) are successively etched anisotropically.

In the case where resin portions are arranged on both sides of the gate 12, these resin portions can be removed, thereby forming void regions beneath the piezoelectric stack 18, 20 and 22. These void regions can then be filled with another material.

Figure 4M:
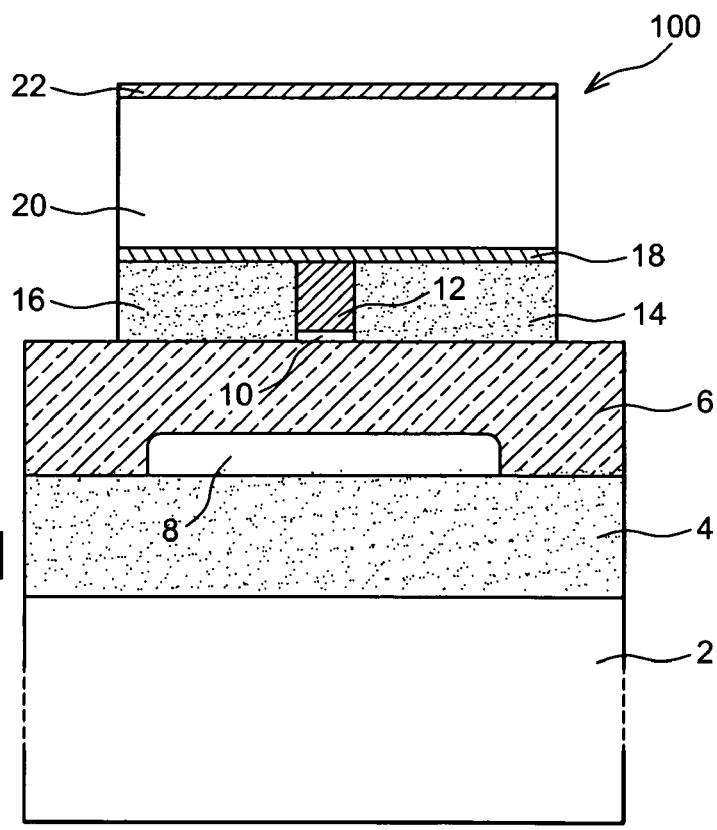
Figure 4N:
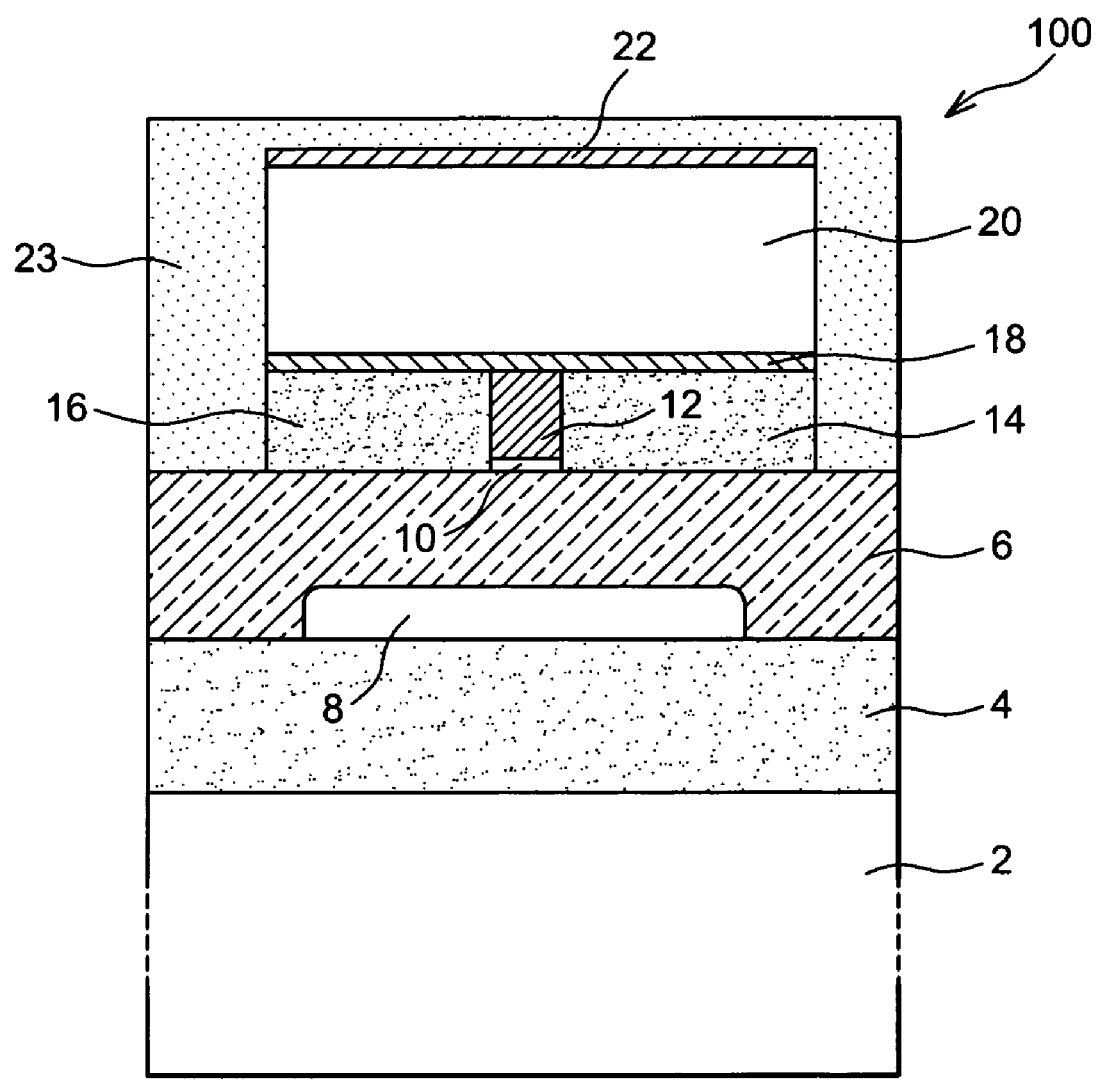
Figure 40:
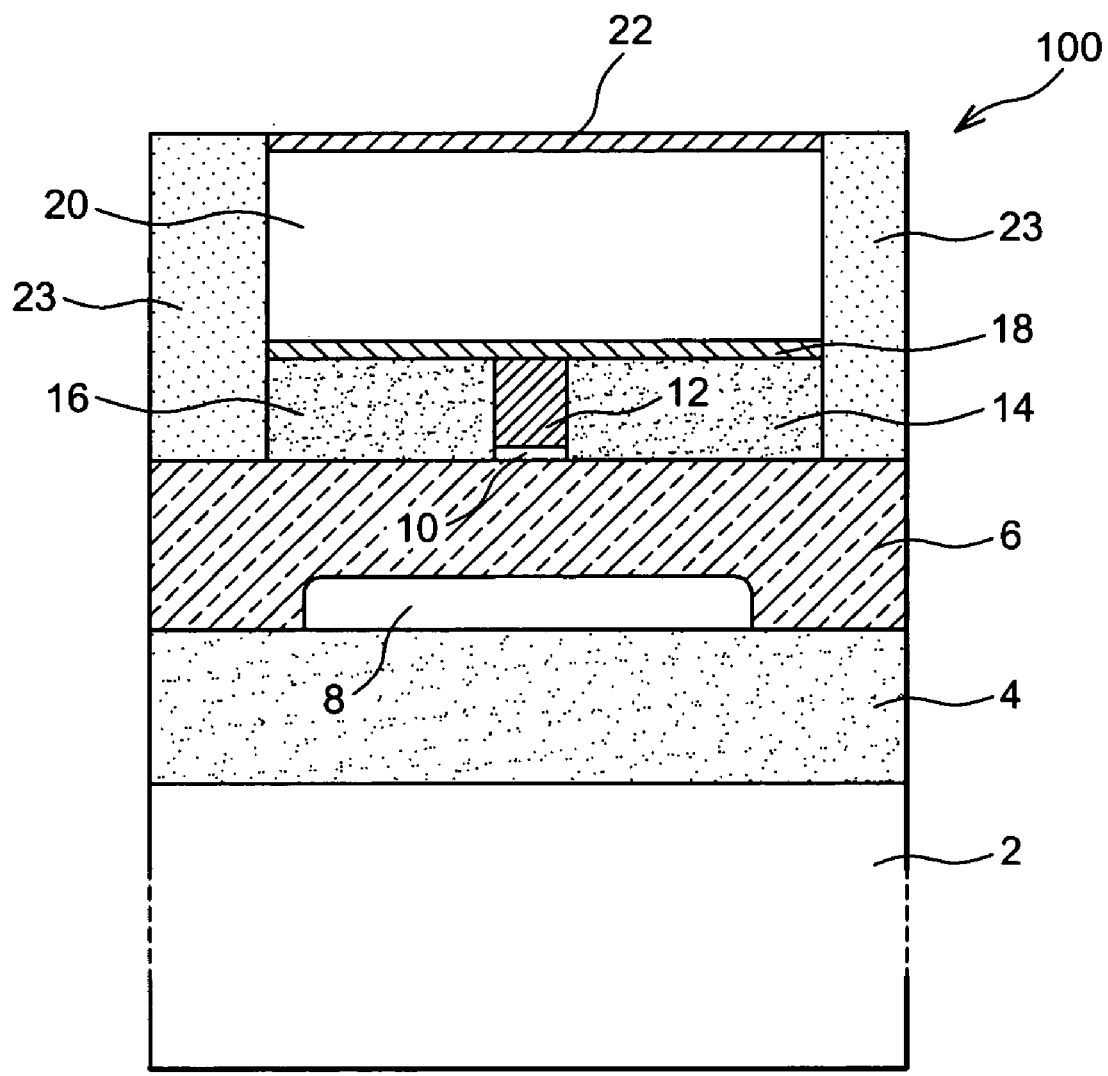

Finally, as shown in FIGS. 4N and 4O, a dielectric deposition 23 is made around the previously etched sites and on the conductive layer 22, and then the upper surface of the structure formed is planarized, stopping at the conductive layer 22 level.

Reference is now made to FIGS. 5A to 5D, in order to describe steps of a method for fabricating the semiconductor device 100 according to a second embodiment.

As in the case of the first embodiment, the steps shown in FIGS. 4A to 4K are implemented so as to form a structure comprising the substrate 2, the dielectric layer 4, the active layer 6, the cavity 8, the gate dielectric 10, the gate 12 and the dielectric portions 14 and 16.

Figure 5A:
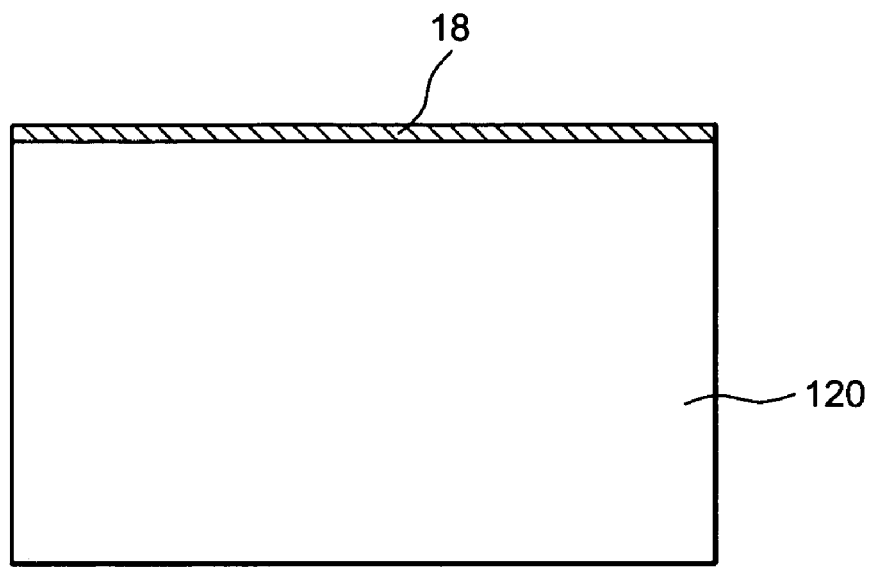
FIGS. 5A to 5D represent steps of a method for fabricating a semiconductor device having a variably strained-channel transistor according to a second embodiment.

As shown in FIG. 5A, a substrate 120 based on a single-crystal piezoelectric material is covered with the electrically conductive layer 18.

Figure 5B:
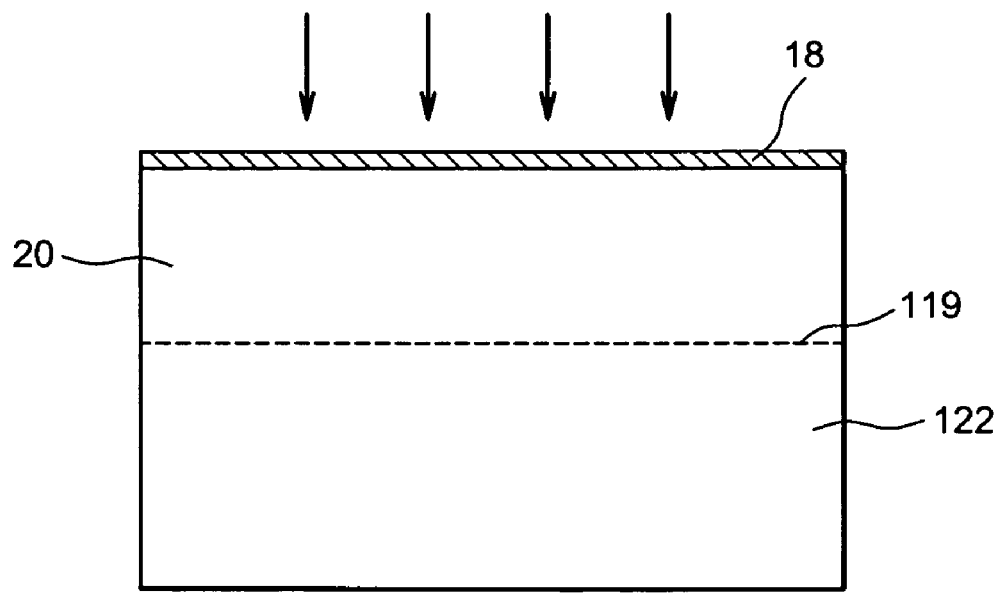

Next, ion implantation is performed on the substrate 120, via the conducting layer 18, and then an annealing operation enabling diffusion of the implanted ions, thereby forming a boundary 119 separating the substrate 120 into two portions 122 and 20 (FIG. 5B). The portion 20 of the substrate 120 in contact with the conductive layer 18 forms the thin layer which will be transferred onto the transistor. Portions 122 and 20 are then separated from one another. This results in the thin layer 20, having a thickness equal to approximately 100 nm, for example, which is obtained by a Smart-Cut™ type method, and which is covered by the conductive layer 18, having a thickness equal to approximately 10 nm, for example.

Figure 5C:
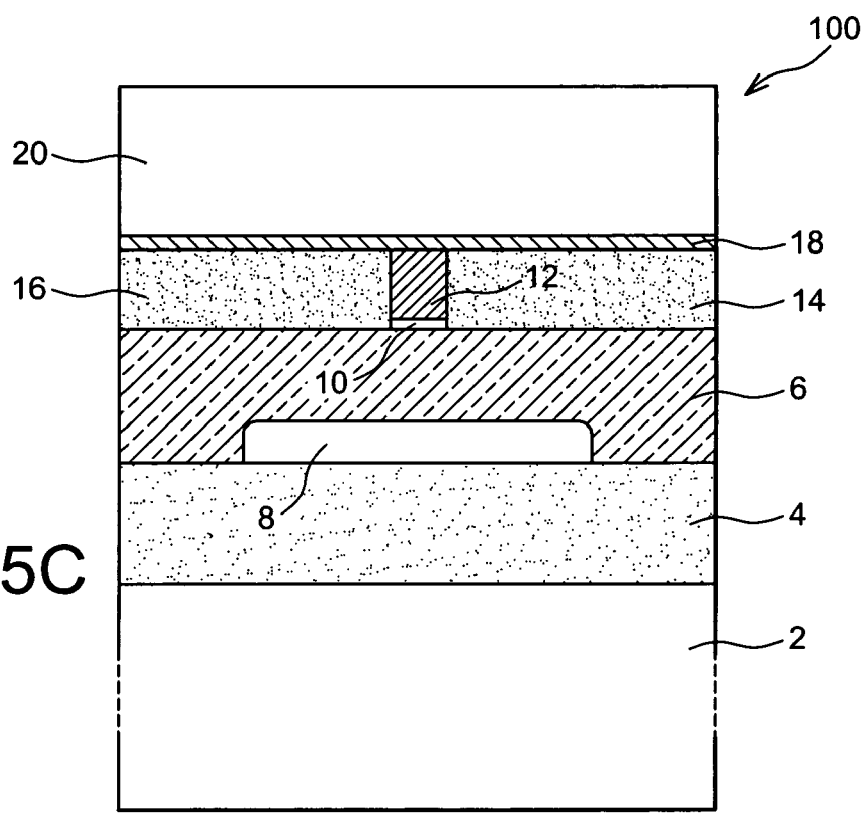

In FIG. 5C, the piezoelectric thin film 20 is then glued via molecular adhesion, by means of the conductive layer 18, onto the gate 12 and the dielectric portions 14 and 16.

Figure 5D:
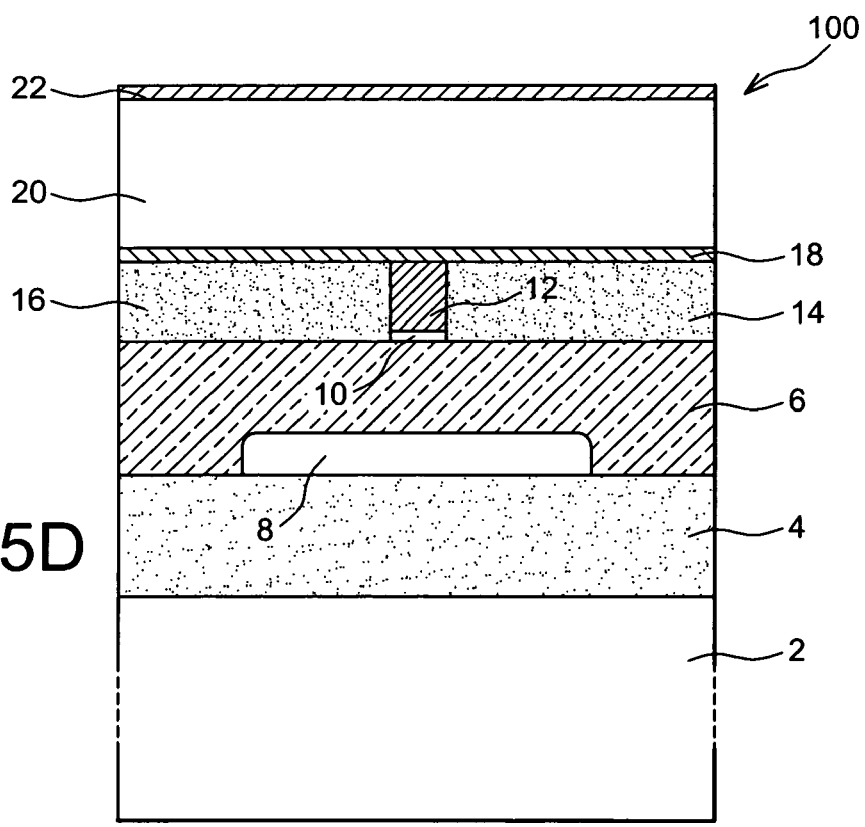

The conductive layer 22 is then deposited on the piezoelectric layer 20, thereby forming the upper electrode of the gate stack of the device 100 (FIG. 5D).

The device 100 is then finished as in the case of the first embodiment, via the steps shown in FIGS. 4M to 4O. In this second embodiment, the surface of the layer 18 serving as the lower electrode is planar, so that the molecular adhesive mechanism may be usable for a piezoelectric layer based on a single-crystal material.

The invention claimed is:

1. Semiconductor device comprising at least:
   one substrate,
   a transistor comprising at least one source region, one drain region, one channel extending in a first direction between the source region and the drain region, and one gate,
   a planar layer based on at least one piezoelectric material, resting at least on the gate and capable of inducing at least mechanical strain on the transistor channel, in a direction that is substantially perpendicular to the plane of a face of the piezoelectric layer situated on the gate side,
   the piezoelectric layer being arranged between two biasing electrodes, one of the two biasing electrodes being formed by a first conductive layer based on at least one electrically conductive material such that the piezoelectric layer is disposed between this first conductive layer and the other of the two biasing electrodes, the other of the two biasing electrodes overlying the gate of the transistor, such that the arrangement of the two biasing electrodes with the piezoelectric layer therebetween forms a stack in a direction that is orthogonal to the first direction.

2. The semiconductor device of claim 1, wherein the first conducting layer is planar.

3. The semiconductor device of claim 1, wherein the dimensions of the faces of the electrodes in contact with the piezoelectric layer are greater than or equal to the dimensions of the faces of the piezoelectric layer in contact with the electrodes.

4. The semiconductor device of claim 1, wherein the other one of the two biasing electrodes is formed by the transistor gate.

5. The semiconductor device of claim 1, wherein the other one of the two biasing electrodes is formed by a second layer comprising at least one electrically conductive layer arranged between the piezoelectric layer and the gate of the transistor.

6. The semiconductor device of claim 5, further comprising a dielectric layer arranged between the gate and the second layer based on a conductive material.

7. The semiconductor device of claim 1, wherein the first conductive layer, and/or the second conductive layer, when the device comprises a second conductive layer, are substantially planar and parallel to the piezoelectric layer.

8. The semiconductor device of claim 1, wherein the first conductive layer, and/or the second conductive layer, when the device comprises a second conductive layer, being based on molybdenum and/or platinum.

9. The semiconductor device of claim 1, wherein the voltage that is intended to be applied to the transistor gate is similar to the voltage intended to be applied to the piezoelectric layer.

10. The semiconductor device of claim 1, wherein the transistor is of the MOS type.

11. The semiconductor device of claim 1, wherein the substrate comprises a layer based on a semiconductor material, upon which are stacked a dielectric layer and an active layer based on a semiconductor material.

12. The semiconductor device of claim 1, wherein the substrate comprises a cavity formed at least beneath the transistor channel.

13. The semiconductor device of claim 12, wherein the cavity is filled with at least one material of which the degree of stiffness is less than that of the substrate material.

14. The semiconductor device of claim 1, wherein the gate is based on polysilicon and/or titanium nitride and/or tantalum nitride.

15. The semiconductor device of claim 1, further comprising at least one portion based on at least one dielectric material arranged on the substrate and beside the gate, covering at least one portion of the source or drain region, while the piezoelectric layer also rests on this dielectric portion.

16. The semiconductor device of claim 15, further comprising a second portion of at least one dielectric material arranged on the substrate and beside the gate, on which the piezoelectric layer can rest, the drain and source regions being at least partially covered by the dielectric portions.

17. The semiconductor device of claim 15, wherein the stiffness of the gate material is greater than the stiffness of the material of the dielectric portion or portions.

18. The semiconductor device of claim 15, wherein the ratio of the stiffness of the gate material to the stiffness of the material of the dielectric portion or portions is greater than 1, and, for example, between approximately 2 and 5.

19. The semiconductor device of claim 15, wherein, when the piezoelectric layer is arranged between two conductive layers, the stiffness of the material of the conductive layers is greater than that of the stiffness of the material of the dielectric portions.

20. The semiconductor device of claim 1, wherein the piezoelectric layer (20) is based on a single-crystal material such as PMN-PT and/or PZN-PT.

21. The semiconductor device of claim 1, wherein the piezoelectric layer is symmetrical in relation to a first plane, which is substantially perpendicular to the plane of the face of the piezoelectric layer situated on the gate side, while the gate is symmetrical in relation to a second plane, which is substantially perpendicular to said plane of the face of the piezoelectric layer situated on the gate side, the first and second planes being superimposed over one another.

22. The semiconductor device of claim 1, wherein the piezoelectric layer is symmetrical in relation to a first plane, which is substantially perpendicular to the plane of the face of the piezoelectric layer situated on the gate side, while the gate is symmetrical in relation to a second plane, which is substantially perpendicular to said plane of the face of the piezoelectric layer situated on the gate side, the first and second planes being offset in relation to one another.

* * * * *